United States Patent [19]

Powell

[11] Patent Number: 5,155,448

[45] Date of Patent: Oct. 13, 1992

[54] FEED-FORWARD AMPLIFIER HAVING INCREASED COMPRESSION POINT

[75] Inventor: Jack Powell, Cestas, France

[73] Assignee: Motorola, Inc., Schaumburg, Ill.

[21] Appl. No.: 690,929

[22] PCT Filed: Nov. 12, 1990

[86] PCT No.: PCT/EP90/01891

§ 371 Date: Jun. 17, 1991

§ 102(e) Date: Jun. 17, 1991

[87] PCT Pub. No.: WO91/07813

PCT Pub. Date: May 30, 1991

[30] Foreign Application Priority Data

Nov. 16, 1989 [GB] United Kingdom ............... 8925960

[51] Int. Cl.$^5$ .................................. H03F 1/32
[52] U.S. Cl. .................................. 330/149; 330/52; 330/51
[58] Field of Search ............. 330/52, 149, 151; 328/163

[56] References Cited

U.S. PATENT DOCUMENTS

| | | | |
|---|---|---|---|
| 3,732,502 | 5/1973 | Seidel | 330/151 X |
| 4,453,133 | 6/1984 | Travis | 332/149 |
| 4,629,996 | 12/1986 | Watanabe et al. | 330/151 |
| 4,943,783 | 7/1990 | Nojima | 332/149 |

Primary Examiner—James B. Mullins
Attorney, Agent, or Firm—Bradley J. Botsch

[57] ABSTRACT

In order to improve the distortion performance of a feed forward corrected amplifier, an amplifier arrangement includes a distortion generator (312) which is coupled between an input (15) and a main amplifier (1). The amplifier arrangement is such that the input signal passes to the distortion generator (312) via a coupler (307). The signal passes via a delay network (310) which compensates for the delay of the distortion generator (312) and is tapped by a coupler (308) to be combined by a coupler (313) with the distorted signal from the distortion generator (312). In this way the output of the distortion generator is subtracted from a sample of the input signal so that only the distortion remains to pass via phase (314) and amplitude (315) correction networks to be amplifier by a gain element (316) before being coupled back into the main signal path by a coupler (309). The correction is active over a portion of the main amplifier characteristics such as the compression region of the main amplifier. Hence the main amplifier (1) compression point may be raised. Raising the compression point increases the overall power handling capability of the main amplifier by increasing the level at which the overall arrangement will saturate to cause distortion.

2 Claims, 2 Drawing Sheets

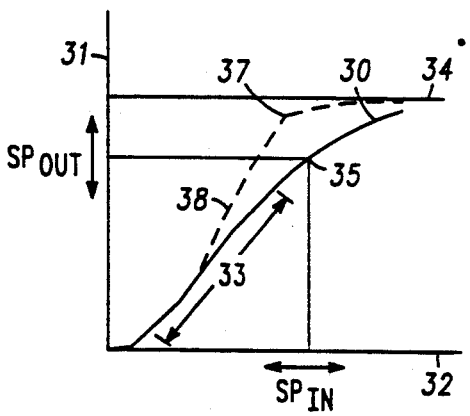
FIG. 1
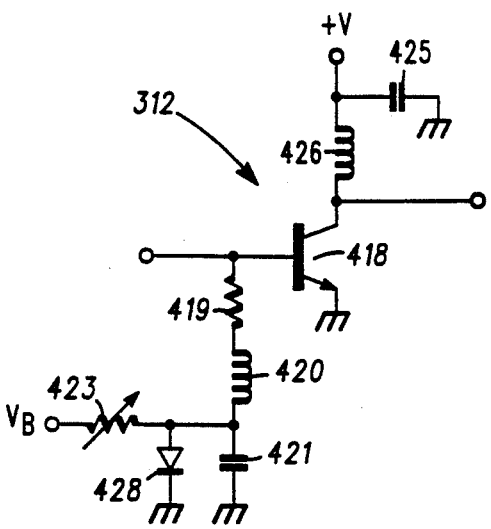
FIG. 4
FIG. 3
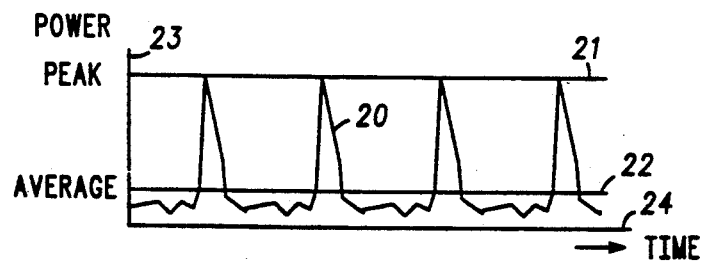
FIG. 5
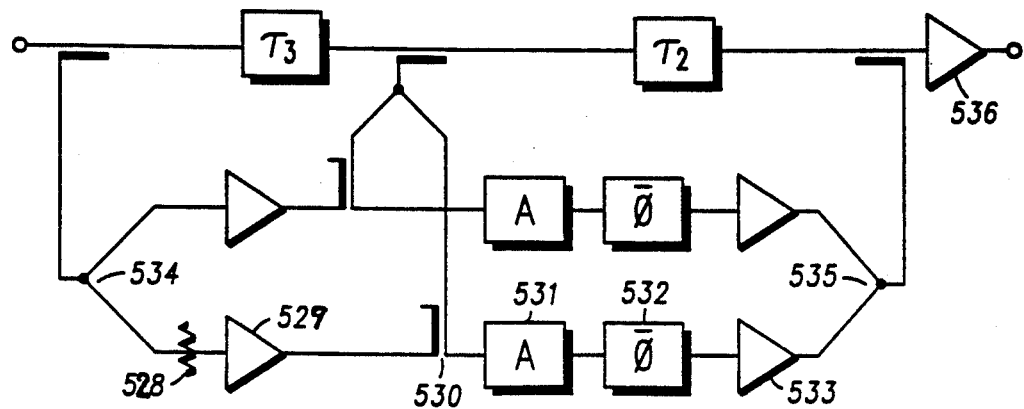

FEED-FORWARD AMPLIFIER HAVING INCREASED COMPRESSION POINT

The present invention relates to amplifiers and in particular to high power amplifiers wherein feed forward cancellation is employed, such as those used in wide band radio-frequency (r.f.) applications.

In amplifier design, there is a trade off to be made between distortion performance and efficiency. Amplifiers which operate under so-called 'Class A' conditions have good distortion but low efficiency whereas an amplifier operated under class C conditions is reasonably efficient but introduces significant distortion. High efficiency and low distortion is the goal, but efficiency increasingly becomes a consideration at high power levels. For example, a typical cellular radio multi-carrier base station amplifier requirement would be 200 w average, 2 kw peak so clearly efficiency must be the best achievable if undue heat dissipation in the amplifier is to be avoided. Unfortunately, the common technique of negative feedback, as used in fixed frequency intermediate frequency amplifiers for example, to correct distortion can only be considered for narrow band applications in r.f. high power amplifiers. For this reason, many r.f. power amplifiers operate in class A with the consequent heat dissipation tolerated.

As an alternative to class A operation, a more efficient class AB amplifier may be employed if feed-forward cancellation is applied. In this technique, the amplifier output (suitably scaled) is compared with the input signal in a first comparison loop to yield an error signal. The error signal is amplified and reintroduced to the output 180° out of phase with the original distortion in a second correction loop, the distortion products being thereby cancelled in the final output. Feed forward can yield a 30 dB improvement in distortion performance but only if both the first comparison loop and the second correcting loop are accurately aligned. Generally the loop parameters do not remain constant over the full operating range of the amplifier and some dynamic correction is required.

Generally, attempts at improving the performance of feed forward amplifiers have centred upon balancing parameters of the comparison loop and the cancellation loop. For an account of such techniques, reference may be made to the applicant's co-pending patent applications reference SC00095EB and SC00097EB both entitled "Improvements in or relating to amplifiers," and filed on the same day as the present application.

A particular problem with feed forward amplifiers is that the power rating of the error amplifier required to correct the worst case conditions may be many times that required to correct average conditions and to avoid the use of large error amplifiers this design aspect is often compromised.

It is well known that the distortion performance of an amplifier may be improved if an input signal is acted upon by a network having a distortion characteristic chosen to be complementary to the distortion characteristic of the following amplifier. U.S. Pat. No. 4,453,133 for example describes a technique in which a predistorting amplifier closely matched to a following main amplifier is employed. An alternative arrangement is described in U.S. Pat. No. 3,732,502 wherein a plurality of narrow band networks is used to match the distortion, although this latter arrangement lacks the advantage of the former in that signal processing at high power levels is required. Either way, reduced distortion is achieved by matching the static characteristic of the predistortion network with that of the distorting amplifier over the range of use. Clearly, it is important that the match be as close as possible over the entire operating range else the process itself introduces distortion. Distortion may also arise due to the dynamic behaviour of the amplifier not being tracked by the static model, although a system as taught by U.S. Pat. No. 4,453,133 can accommodate a degree of dynamic shift if the performance of the main amplifier can be adequately mirrored.

Feed forward amplifiers, particularly those operating in class AB can show significant dynamic performance variations which negates the use of static predistortion. Unfortunately since feed forward corrected amplifiers are typically multi-stage ganged amplifiers, a model to yield identical dynamic behaviour is impractical.

According to the present invention an amplifier arrangement having an input and an output and a feed forward corrected amplifier to provide the output includes intermediate the input and amplifier a distortion generator, the distortion generator having a distortion characteristic complementary to the distortion characteristic of the amplifier over a portion thereof.

Preferably said portion of said distortion characteristic is substantially the compression region. Advantageously said distortion generator comprises a model of said amplifier.

In one form of the present invention said amplifier may be a multi-mode amplifier, the arrangement including a plurality of distortion generators.

In order that features and advantages of the present invention may be further appreciated, embodiments will now be described, by way of example only, with reference to the accompanying diagrammatic drawings, of which:

FIG. 1 represents a typical amplifier characteristic,

FIG. 3 represents a typical input signal envelope, FIG. 4 is a distortion generator and FIG. 5 represents an alternative embodiment of the present invention.

Figure 2:
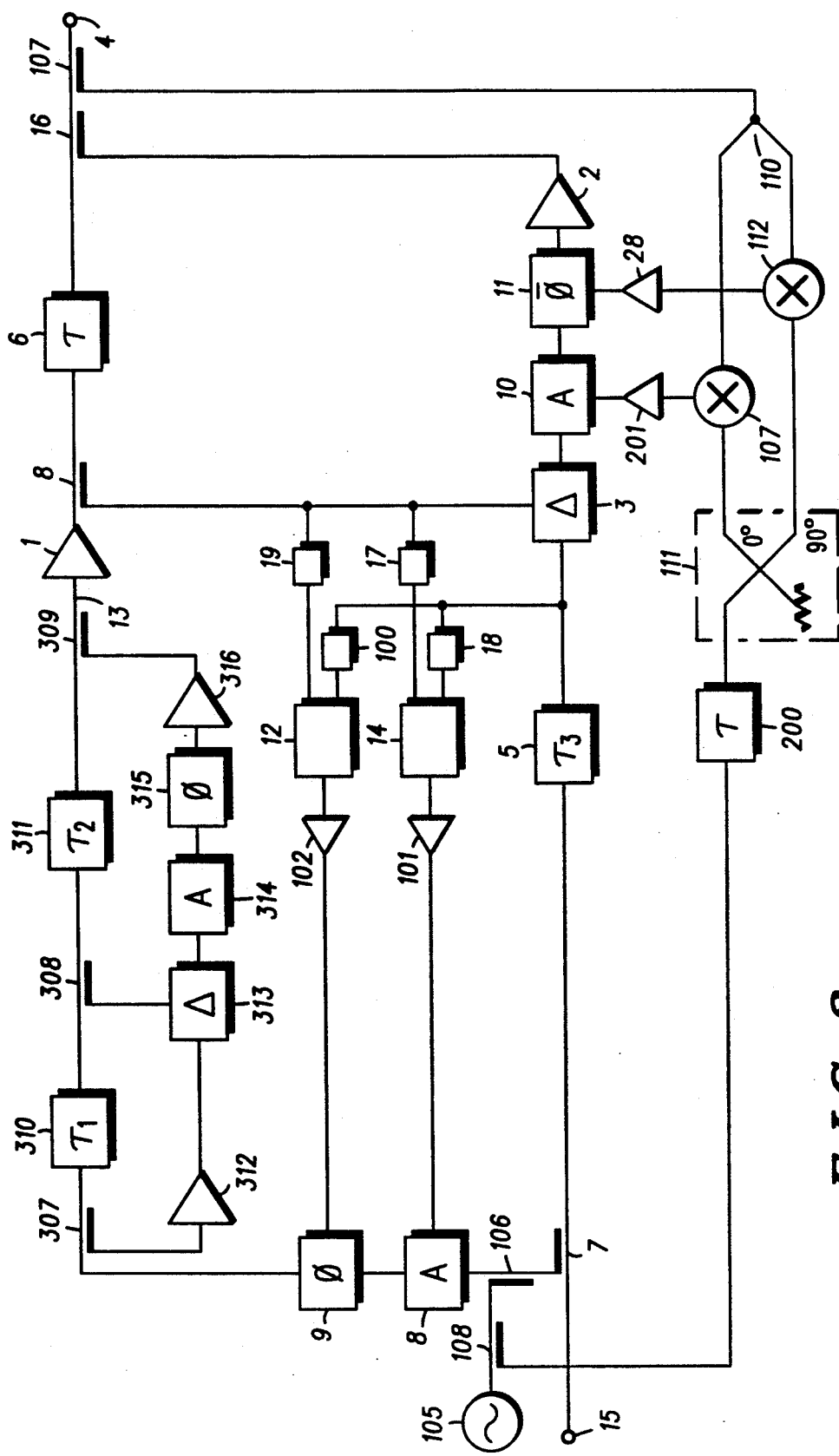
FIG. 2 represents an amplifier arrangement in accordance with the present invention.

Firstly, the nature of the distortions arising in wideband high power amplifiers will be considered.

A typical characteristic 30 (FIG. 1) of output power 31 against input power 32 of a wideband r.f. high power amplifier exhibits a region 33 of approximate linearity, being the normal operating region of the amplifier. As the input power of the input signal is increased beyond this region, towards saturation level 34, the amplifier cannot fully respond to an input variation. This is said to be the compression region, the 1 dB compression point 35 being that at which the response P out is 1 dB down to an input change Pin compared with a linear response.

It will be noted however that even in the operating region 33, non-linearities are present. It is known to attempt to correct such distortion by applying predistortion to the input before application to the amplifier, the predistortion having a characteristic complementary to the amplifier non-linearities. Unfortunately, there are sound reasons why this technique has not been applied to class AB r.f. wideband amplifiers. Firstly, for example, the dynamic behaviour of such amplifiers departs from the simple static characteristic 30. Their response is envelope dependent, thermal and bias parameters being affected. Secondly, such amplifiers are typically multi-stage and/or ganged arrangements making the derivation of a model to provide the required complementary characteristic substantially impossible. For this reason the technique of feed forward cancellation is traditionally employed with such amplifiers and the present invention, an embodiment of which will now be considered, concerns such arrangements.

An r.f. wideband high power amplifier 1 (FIG. 2) receives an input signal at its input 13 via a coupling 7 whenever a signal for amplification is applied to input port 15. The output of the amplifier 1 is tapped by a coupler 8 and fed to an input of a comparator 3, which may take the form of another directional coupler. The input signal applied at port 15 is fed to a second input of comparator 3 via a delay line 5, arranged to introduce a delay substantially equal to that of the power amplifier 1. Comparator 3 thus produces at its output an error signal representative of the difference between the input signal fed via the amplified and the delayed path. The amplified and the delayed paths constitute the comparison loop of a feed forward arrangement. If the comparison loop is balanced, the error signal produced at the output of the comparator 3 is representative of distortion introduced by the power amplifier 1 and is fed via amplitude and phase matching networks 10,11 to an error amplifier 2 and thence to an input of a combiner 16, which may take the form of a directional coupler.

A second input of combiner 16 receives the output signal of the power amplifier 1 via a delay line 6 arranged to introduce a delay substantially equal to that introduced by comparator 3, matching networks 10 and 11 and error amplifier 2. Delay lines 5 and 6 may for example take the form of a length of coaxial cable transmission line. Combiner 16 serves to introduce the amplified error signal to the amplifier output signal such that the error signal is in anti-phase therewith. The resultant signal produced at output port 4 thus has had feed forward distortion cancellation applied; the delayed path via network 6 and the error signal path via amplifier 2 constituting the cancellation loop of the feed forward arrangement.

The arrangement further includes an amplitude compensating network 8 in the form of a PIN-diode attenuator, controlled by a signal from a comparator 14. Comparator 14 provides a control signal to the attenuator 8 in accordance with the respective levels of signal from a first detector 17 and a second detector 18. First detector 17 is an envelope detector for extracting the envelope level of the amplified input signal, which when compared with the level of the delayed input signal extracted by a second envelope detector 18 coupled to the output of the delay network 5, yields a control signal representative of amplitude distortion introduced by power amplifier 1. In an analogous way, a second compensating network 9 receives a control signal from a phase sensitive detector 12, being derived from the outputs of detectors 19 and 100. This signal is representative of the phase distortion. Gain is provided in the amplitude and phase loops by amplifiers 101, 102 respectively.

Detectors 17 and 18 and their associated control loops have fast response times to keep the comparison loop in balance during at least part of the compression region. By these means, the level of the distortion products giving rise to the feed forward error signal is reduced, giving an overall improvement in the performance of the amplifier arrangement.

An oscillator 105 is arranged to provide a pilot tone which is coupled into the power amplifier input 13 by a coupler 106. It should be noted that coupler 106 and 7 are arranged such that the oscillator signal is not coupled into input signal path. This may be achieved by providing sufficient directivity from couplers 106 and 7. Since the pilot tone travels via a path through the amplifier 1 only to combiner 16, it will contribute to the error signal and hence be cancelled by the cancellation loop. Thus the pilot tone will contribute distortion to the eventual output produced at port 4 that is no greater than the residual distortion that remains incorrected by the feed-forward loops.

The oscillator feeds a first input of a multiplier 107 via a coupler 108, the second input of which is derived from the eventual output via a coupler 110. As will be apparent to those skilled in the art when there is amplitude mis-alignment the output of the multiplier provides a maximum output when the residual pilot tone is in phase with the input signal from the oscillator. When the loop is to be aligned, delay network 200 is adjusted for maximum output from mixer 107. This output of mixer 107 is fed as a control signal to network 10, being a controllable attenuator used to adjust the amplitude of the error signal output of comparator 13 prior to amplification by error signal amplifier 2. Thus it will be appreciated that amplitude errors in the cancellation loop resulting in uncancelled distortion may be corrected by this mechanism.

Suppose, for example that the gain of amplifier 2 is less than its nominal design value by $-G$. Correction network 10 must thus provide G less attenuation to maintain alignment. In the non-aligned condition, some portion of the pilot tone appears at output 4 and is thereby coupled to an input of mixer 107. The mis-alignment produces a response of magnitude E at the output of mixer 107 which is amplified by a control amplifier 201 to give a signal of magnitude $G_c.E$ driving network 10, where $G_c$ is the gain of control amplifier 201. The sign of $G_c$ has to be such that if E is produced by a lack of gain in amplifier 2, $G_c$ reduces the attenuation in network 10. It is desirable that a high gain amplifier 201 is provided.

In a way analogous to amplitude control network 10, network 11 is arranged to control the phase of the error signal applied to error amplifier 1. Network 11 is controlled by the output of multiplier 112 which receives the eventual output signal via a coupler 110 at its first input and a quadrature oscillator reference via 90° coupler 111. It will be appreciated that the output of multiplier 112 is representative of that component of the pilot tone present in the eventual output at 104 that is in quadrature with the oscillator signal; thus phase errors in the cancellation loop resulting in uncancelled distortion are corrected.

It will be appreciated that the feed forward amplifier as thus far described represents a very high performance arrangement, incorporating as it does both comparison and cancellation loop correction. Any amplifier, however, will eventually cause distortion if the input level becomes too high. For a signal composed of n tones of equal power, the peak power through the main amplifier 1 can equal n times the average power, or $n^2$ times the power of one tone. This however happens during short periods of worst case conditions when all the tones add in phase. A typical envelope 20 (FIG. 3) (power 23 against time 24) of such a signal with a large number of tones shows a very high peak power level 21, with much lower average power level 22. Typically, the error amplifier (2) of a feed forward arrangement may have one tenth (say 100 w) of the power handling capability of the main amplifier (1), with a 10 dB output coupler (16). Suppose the main amplifier 1 dB compression point is at 1 KW. The missing power at the peak is 200 w, which to be supplied by the error amplifier through the 10 dB coupler would be 2 KW, which is impossible and distortion ensures. In many designs, this aspect is compromised and for a number of tones larger than 10, the 1 dB compression point of the main amplifier is made 10 times the average signal power. This, of course still means that the main amplifier runs typically at one tenth of its capability with consequently poor efficiency.

In accordance with the present invention the amplifier arrangement includes a distortion generator 312, intermediate the input 15 and the main amplifier 1. The arrangement is such that the input signal passes to the distortion generator 312 via a coupler 307. The signal passes via a delay network 310 which compensates for the delay of distortion network 312 and is tapped by a coupler 308 to be combined by a coupler 313 with the distorted signal from the distortion generator 312. In this way the output of the distortion generator is substracted from a sample of the input signal so that only the distortion remains to pass via phase and amplitude correction networks respectively 314 and 315 to be amplified by a gain element 316 before being coupled back into the main signal path by a coupler 309.

The correction is active over a portion of the amplifier characteristic only. In particular in the present embodiment the correction is active in the compression region of the amplifier Hence the 1 dB compression point may be raised to a point 37 to give an overall amplifier arrangement characteristic 38 (FIG. 1). It will be appreciated that raising the compression point increases the overall power handling capability of the amplifier by increasing the level at which the overall arrangement will saturate to cause distortion. Alternatively for an amplifier of the same rating a smaller error amplifier in the feed forward arrangement may be used. It will be appreciated that the present invention is a considerable departure from prior art predistortion techniques in that the correction is applied over a portion of the amplifier characteristic only. In the present example it is likely that the distortion generator will itself add to the non linearities present in the operating region 33 of the amplifier, but overall this will not matter since the subsequent feed forward arrangement will itself cancel this extra distortion as well as the existing non linearities. The important point is that the compression point of the amplifier has been increased, to point 37, for example.

It is advantageous that the distortion generator models the performance of the main amplifier if possible. It may for example take the form of a single transistor (418) FIG. 4, itself operated in class AB to reproduce in some measure the dynamic behaviour of the main power amplifier. The characteristics of the distortion generator 312 based upon the transistor 418 are chosen in the following way.

To provide similar thermal effects the output power capability of 312 has to be chosen accurately. If the losses through 307, 310, 308, 311, 309 are neglected, and if $G_{312}$ and $G_1$ are the gains of amplifiers 312 and 1 respectively, and $C_{307}$ the coupling ratio of 307, then if Pout is the output power capability of 1, the output power capability of 312 will be $P = P_{out} \cdot G_{312} \cdot G_1 \cdot G_{307}$ The transistor 418 is biased in a class AB configuration. The idling current is set through potentiometer 423 and diode 422. This current is adjusted to have identical relative levels of 3rd 5th and 7th orders of distortion as in the power amplifier. Envelope effects, other than thermal, are adjusted by the selection of resistor 419, inductor 420 and capacitor 421.

A further embodiment of the present invention will now be described. A complex mixed mode power amplifier 536 (FIG. 5) as is typical in wideband r.f. applications, has characteristics that are a combination of class AB behaviour and class A behaviour (less non-linearity) are exhibited. For example, the 5th 7th 9 th order terms may have a strictly class AB behaviour while the 3rd order displays a null a high power. To account for these effects the present embodiment includes an independent 3rd order generator taking the form of a class A amplifier 529. This generator may be a single transistor biased in class A, or a monolithic amplifier. PAD 528 insures that only 3rd order is generated. Phase and amplitude adjustments 531 532 533 of this distortion component are independent from that of the class AB generator and combine in 535 to follow as far as possible the complex behaviour of power amplifier 536. When a null in 3rd order occurs in amplifier 536 the class AB path is adjusted at levels below the null, then the class A path is adjusted at levels above the null insuring the transition from one mode to the other.

I claim:
1. An amplifier arrangement having an input and an output and feed forward correction to provide the output, the amplifier arrangement including a main amplifier having an input and an output, the input of the amplifier arrangement being responsive to an input signal, the amplifier arrangement comprising:
a distortion generator coupled between the input of the amplifier arrangement and the input of the main amplifier, the distortion generator having a distortion characteristic complementary to the distortion characteristic of the main amplifier over a portion thereof,
said feed forward correction including:
   a comparison loop having comparison means for comparing the output of the main amplifier with a delayed input signal to provide an error signal; and
   a cancellation loop including secondary amplifier means for amplifying said error signal to provide an amplified error signal, and combining means for combining said amplified error signal with a signal appearing at the output of the main amplifier
a compensating network coupled between the input of the amplifier arrangement and said distortion generator;
a first detector coupled to said main amplifier output to derive a parameter thereof;
a second detector coupled to receive said delayed input signal to derive a parameter thereof; and
means for comparing the respective outputs of said detectors to derive a control signal which is applied to a control input of compensating network, the response time of said control signal being less than the period of the highest frequency of said error signal.

2. An amplifier arrangement having an input and an output and feed forward correction to provide the output, the amplifier arrangement including a main amplifier having an input and an output, the input of the amplifier arrangement being responsive to an input signal, the amplifier arrangement comprising:

a distortion generator coupled between the input of the amplifier arrangement and the input of the main amplifier, the distortion generator having a distortion characteristic complementary to the distortion characteristic of the main amplifier over a portion thereof, said feed forward correction including:

a comparison loop including comparison means for comparing the output of the main amplifier with a delayed input signal to provide an error signal; and a cancellation loop including secondary amplifier means for amplifying said error signal to provide an amplified error signal and combining means for combining said amplified error signal with a signal appearing at the output of the main amplifier;

a pilot generator coupled to the input of the main amplifier to introduce a pilot tone thereat;

detector means for detecting a level of said pilot tone appearing at the output of the amplifier arrangement; and correction means responsive to said detection means for correcting said cancellation loop performance wherein said pilot generator is further coupled to a multiplier having an input coupled to the output of the main amplifier, said multiplier providing an output signal arranged to control a loop parameter of said cancellation loop.

* * * * *